United States Patent
Wu et al.

(10) Patent No.: US 6,494,666 B2
(45) Date of Patent: Dec. 17, 2002

(54) SIMPLIFIED AND ENHANCED SCARA ARM

(75) Inventors: Kung Chris Wu, Sunnyvale, CA (US); John M. Rush, Mountain View, CA (US); Torben Ulander, Sunnyvale, CA (US)

(73) Assignee: Fortrend Engineering Corporation, Sunnyvale, CA (US)

( * ) Notice: Subject to any disclaimer, the term of this patent is extended or adjusted under 35 U.S.C. 154(b) by 15 days.

(21) Appl. No.: 09/771,159

(22) Filed: Jan. 26, 2001

(65) Prior Publication Data

US 2002/0102155 A1 Aug. 1, 2002

(51) Int. Cl.⁷ .............................................. B66C 23/00
(52) U.S. Cl. .................................................... 414/744.3
(58) Field of Search .......................... 414/744.5, 744.3, 414/783, 758; 901/15, 9, 3, 28, 49; 318/566.11

(56) References Cited

U.S. PATENT DOCUMENTS

| | | |
|---|---|---|
| 4,947,702 A | 8/1990 | Kato |
| 4,965,500 A * | 10/1990 | Mizuro et al. ............... 901/3 X |
| 5,064,340 A | 11/1991 | Genov et al. |
| 5,170,109 A * | 12/1992 | Yanagita et al. ............ 901/3 X |
| 5,178,512 A | 1/1993 | Skrobak |
| 5,364,222 A * | 11/1994 | Akimoto et al. ..... 414/744.3 X |
| 5,402,050 A * | 3/1995 | Ozawa ....................... 901/9 X |
| 5,741,113 A | 4/1998 | Bacchi et al. |
| 5,746,565 A | 5/1998 | Tepolt |
| 5,789,890 A | 8/1998 | Genov et al. |
| 5,944,476 A * | 8/1999 | Bacchi et al. ................ 414/783 |
| 6,135,702 A * | 10/2000 | Huang et al. ............. 901/49 X |
| 6,318,951 B1 * | 11/2001 | Schmidt et al. ........... 901/15 X |

\* cited by examiner

Primary Examiner—Donald W. Underwood
(74) Attorney, Agent, or Firm—D. E. Schreiber

(57) ABSTRACT

A three DOF SCARA arm, adapted for transporting semiconductor wafers, includes an end-effector assembly at a distal joint of the arm. In one configuration, the end-effector turns a workpiece over. The arm includes a support column having an open column assembly that projects above a base. Within the assembly, a Z-axis drive energizes extension and retraction of a hollow tube carried by the support column. A shaft, rotatable about the Z-axis and having a distal end furthest from the support column's base, receives an arm assembly. An arm-assembly rotary-drive energizes the shaft's rotation. An arm base-plate, secured to the shaft's distal end, supports the arm assembly therefrom. The arm base-plate carries a wrist joint that is displaced from the Z-axis, and receives the end-effector whose rotation about a wrist-joint axis is energized by an end-effector rotary-drive.

13 Claims, 13 Drawing Sheets

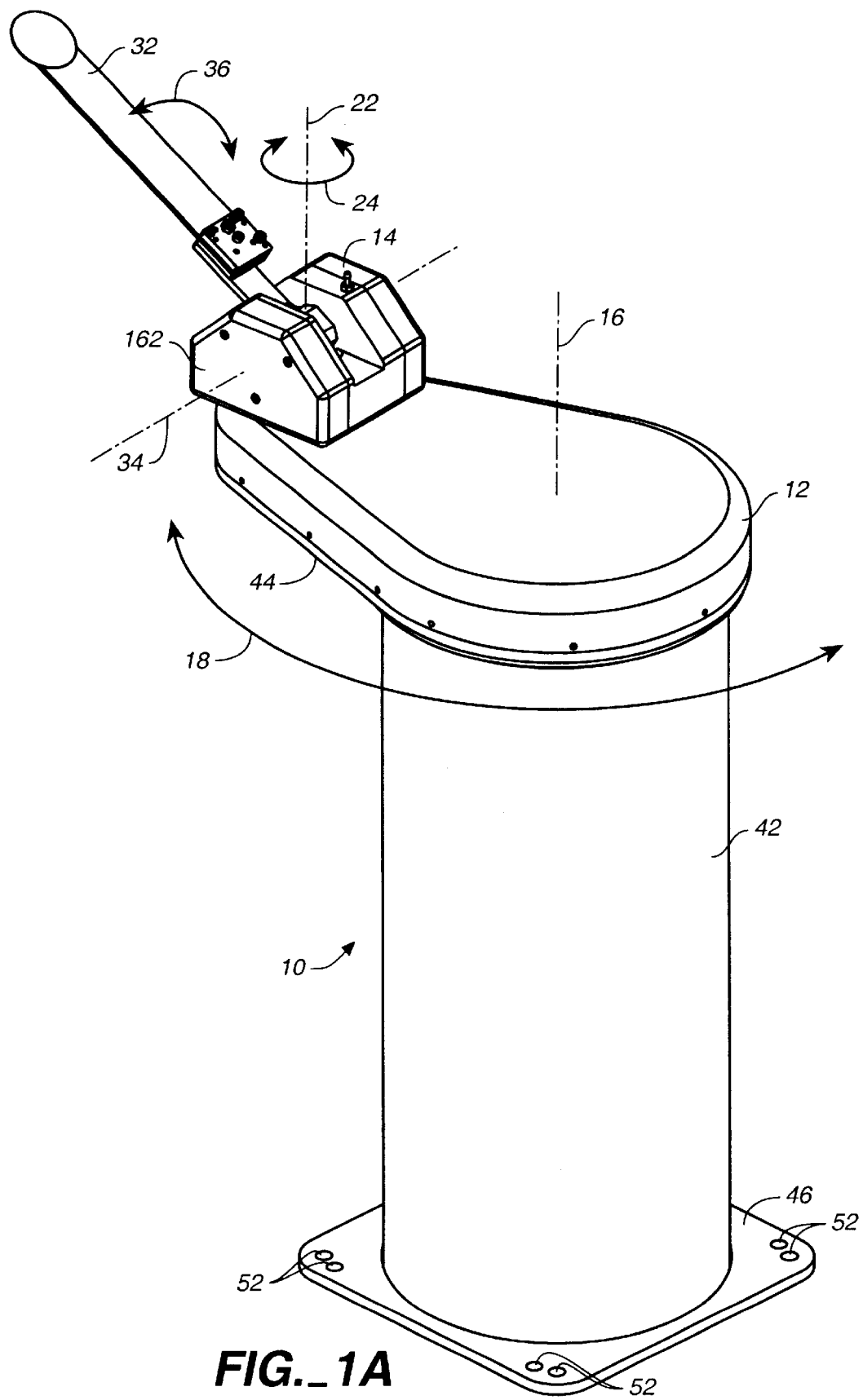
FIG._1A

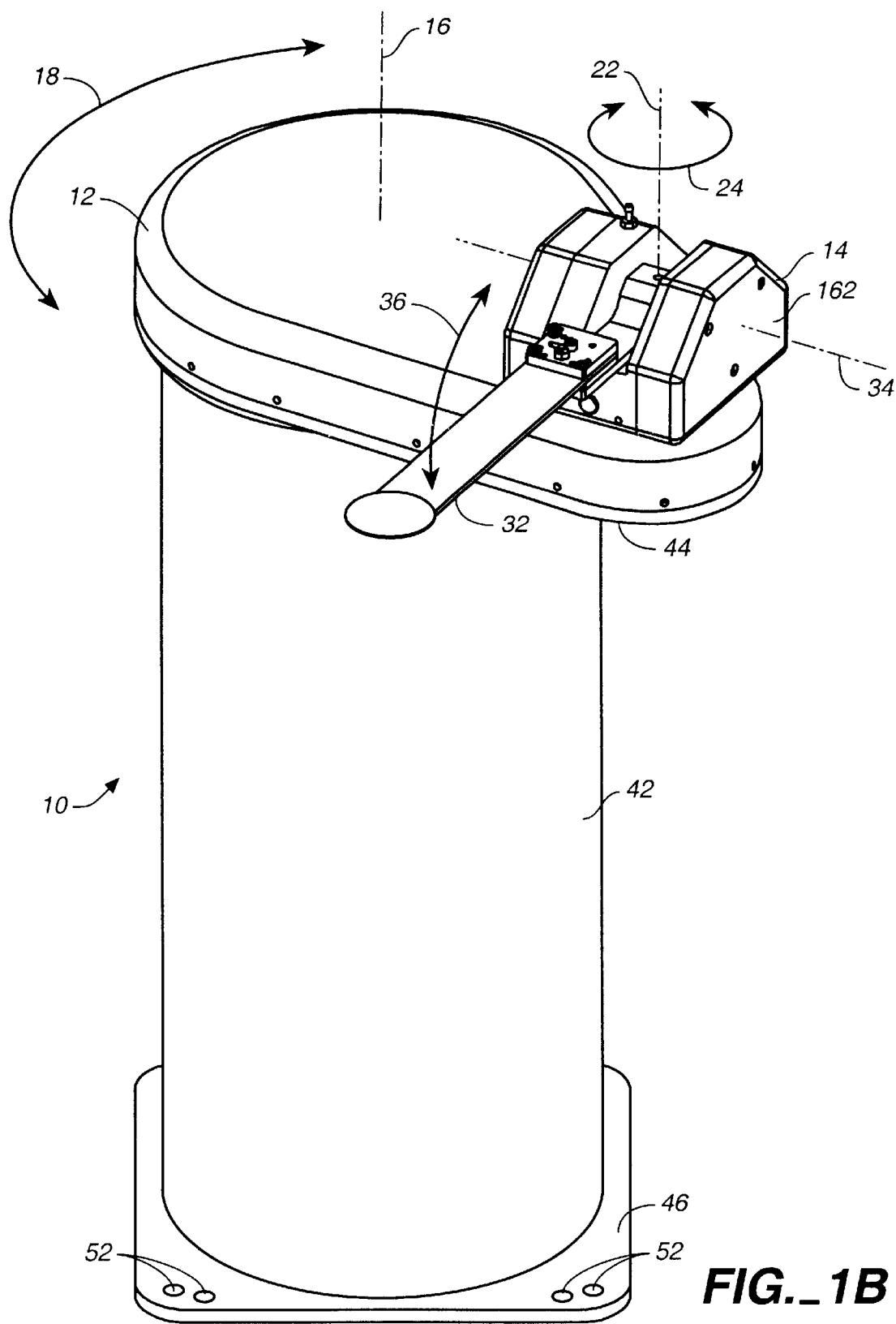
FIG._1B

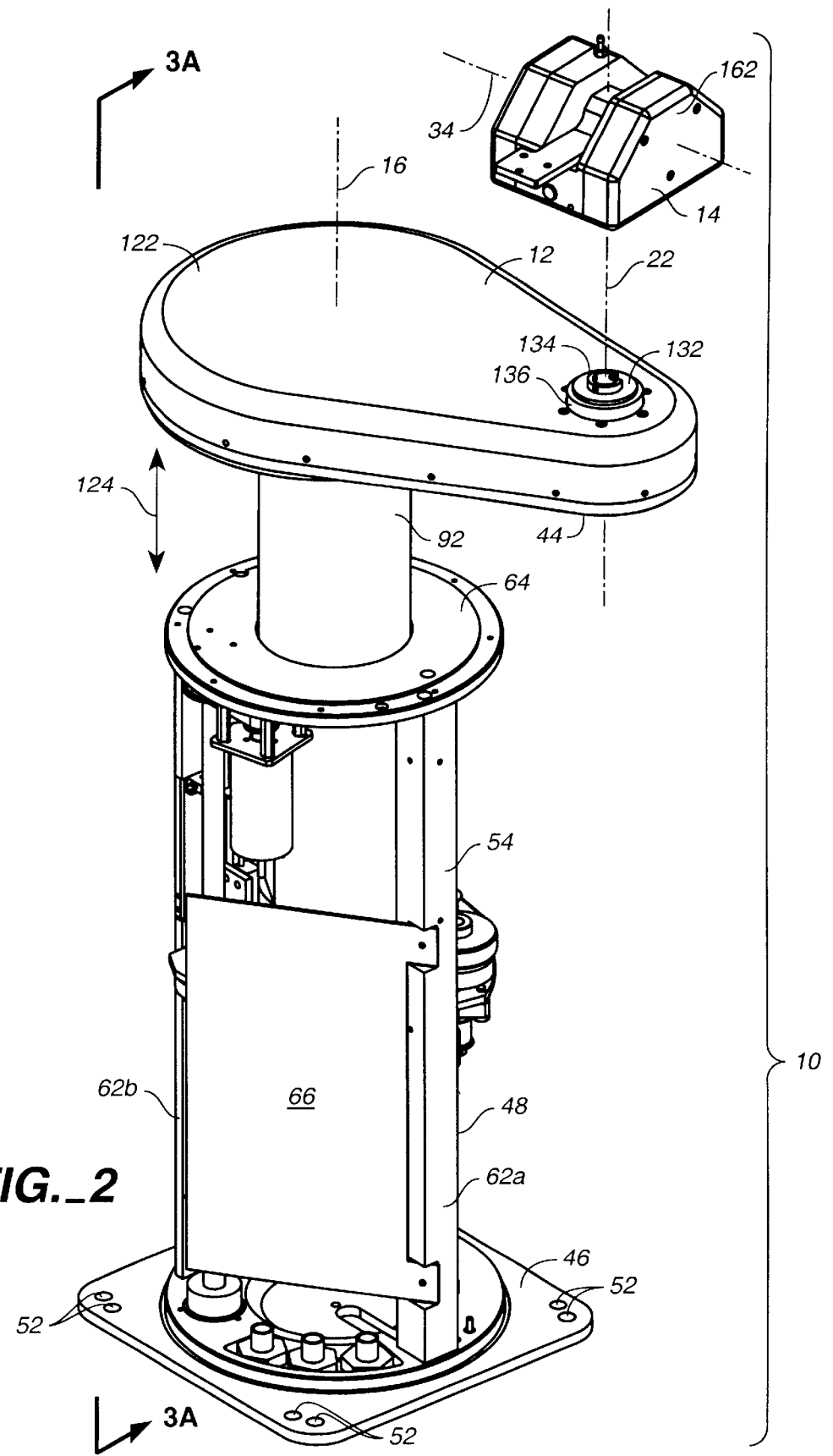
FIG._2

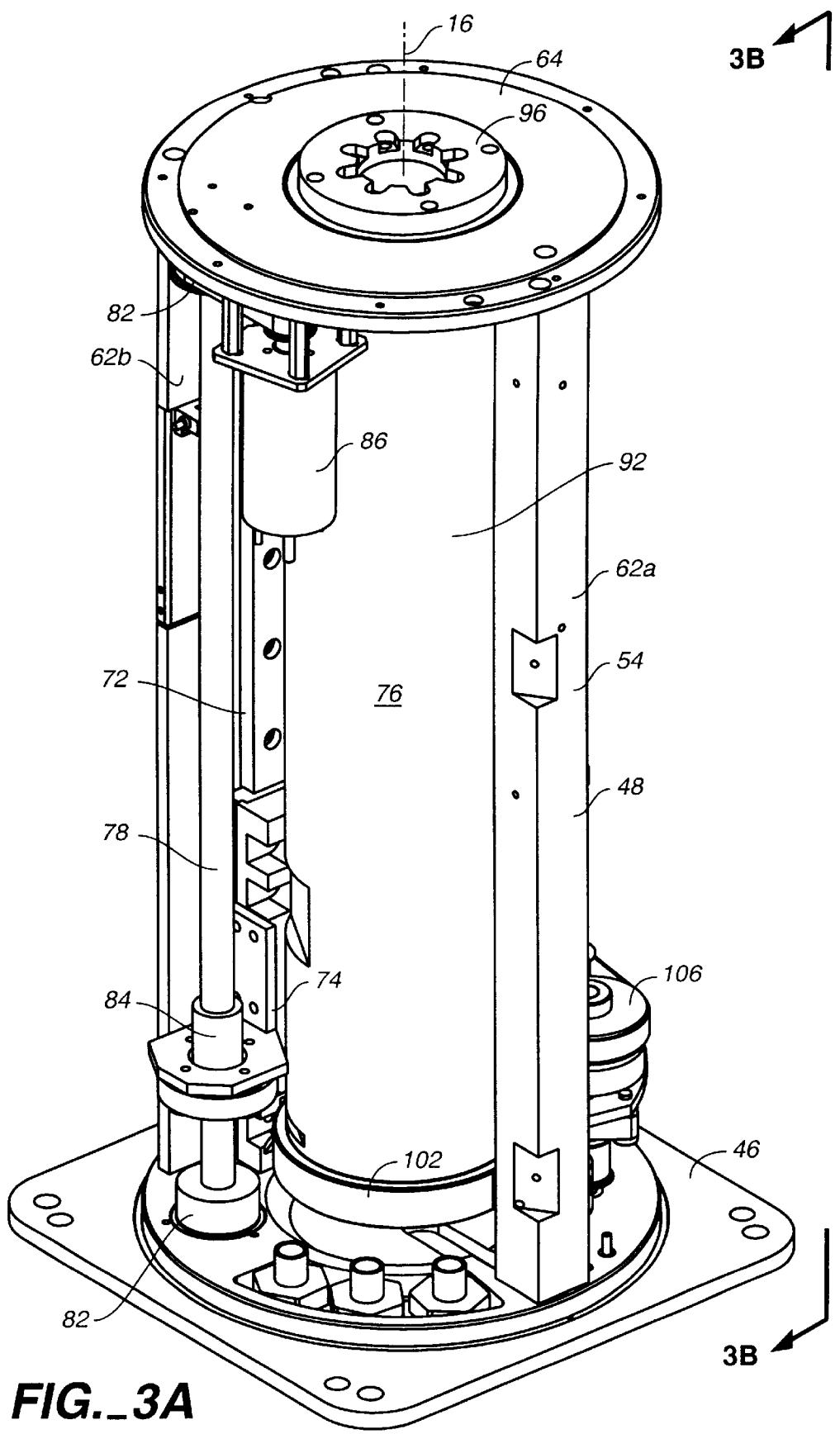
FIG._3A

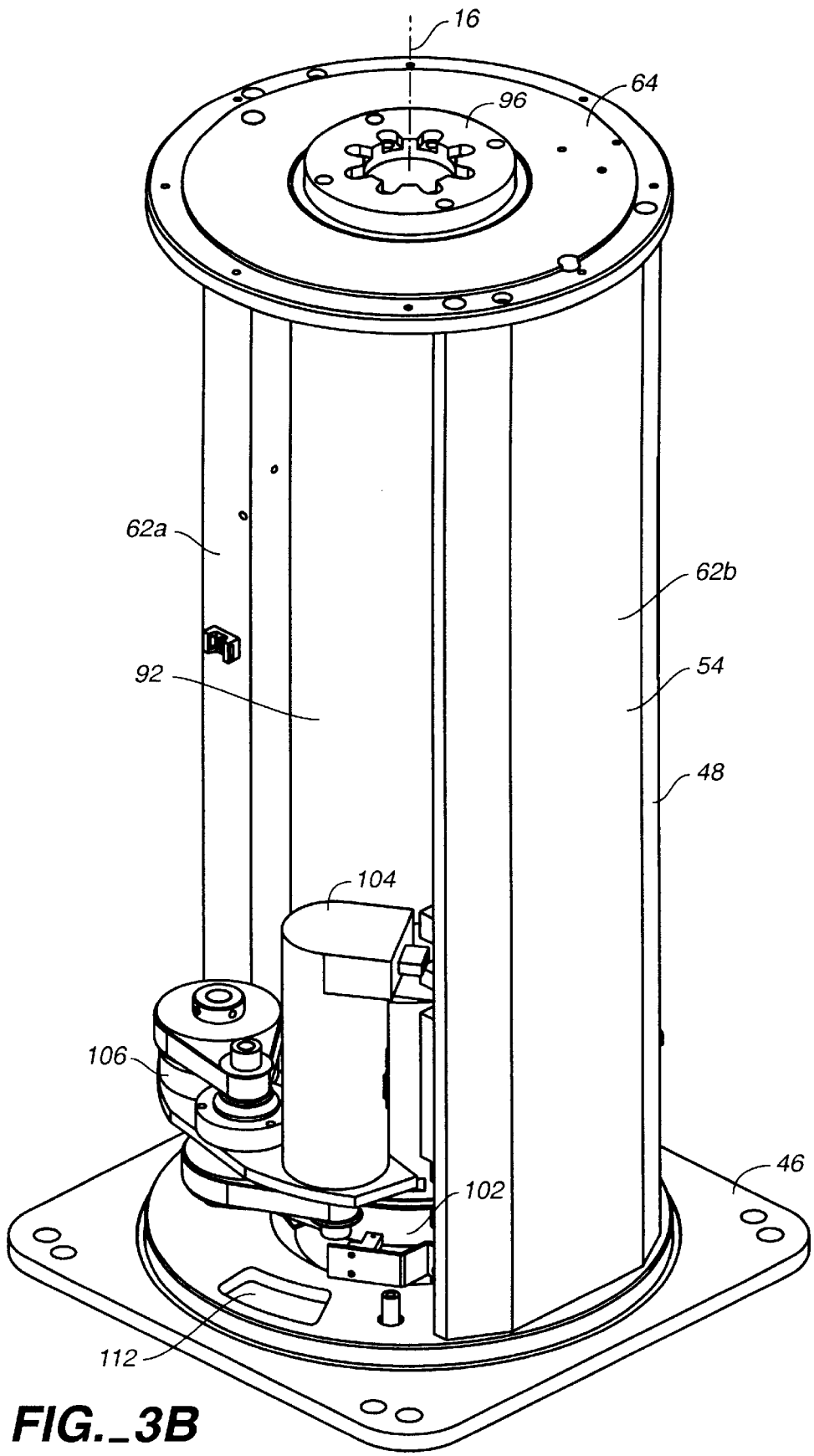
FIG._3B

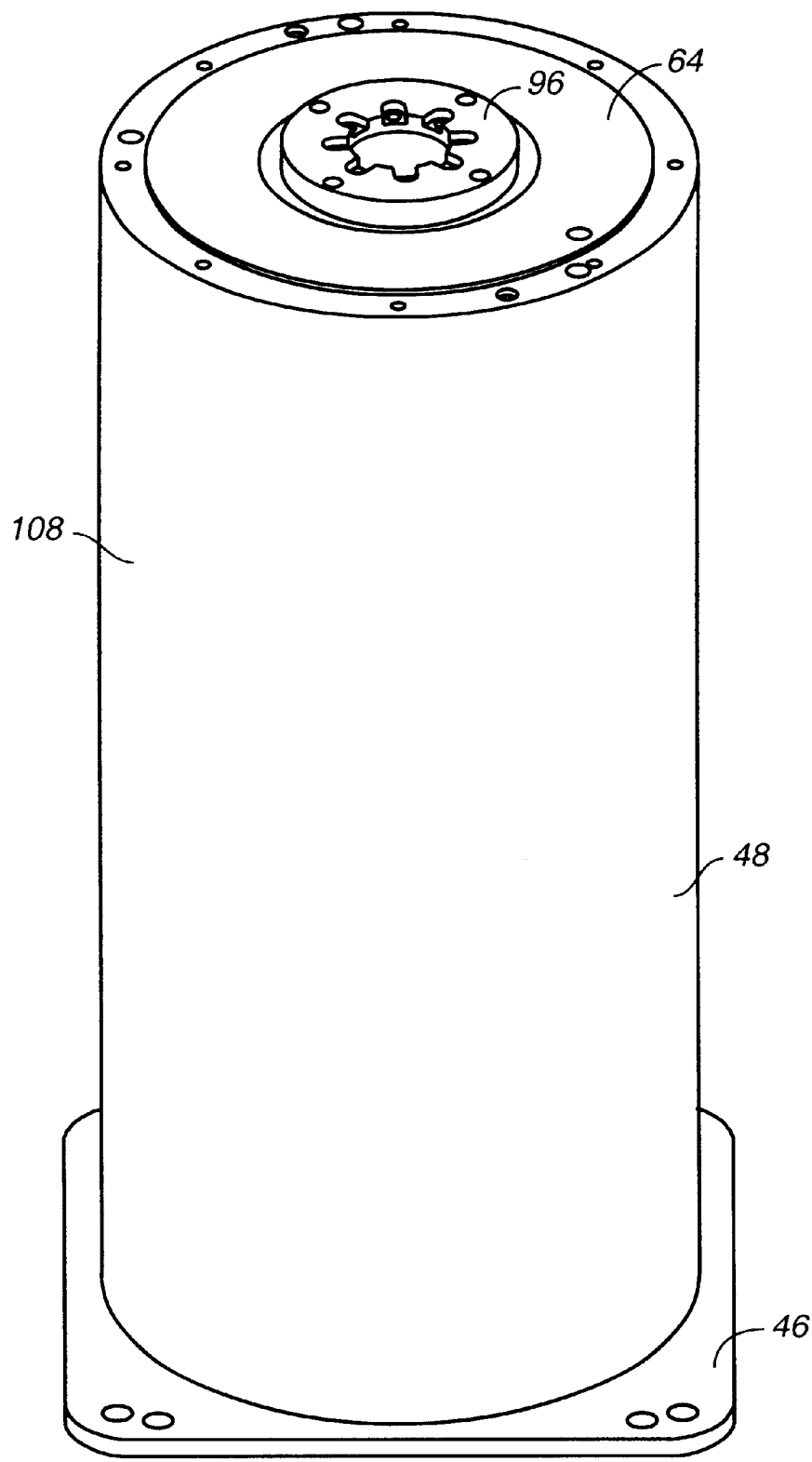
FIG._3C

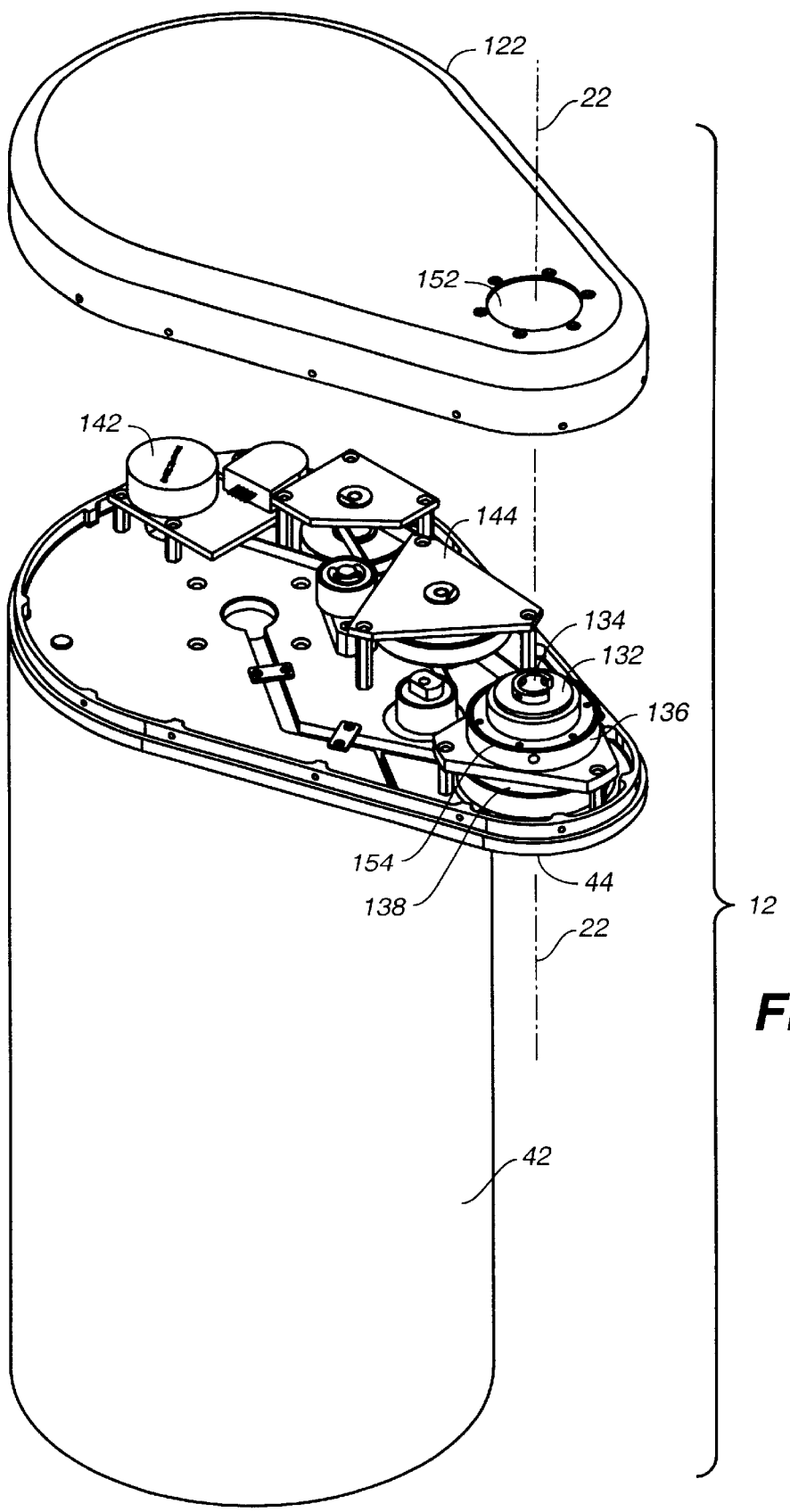
FIG._4

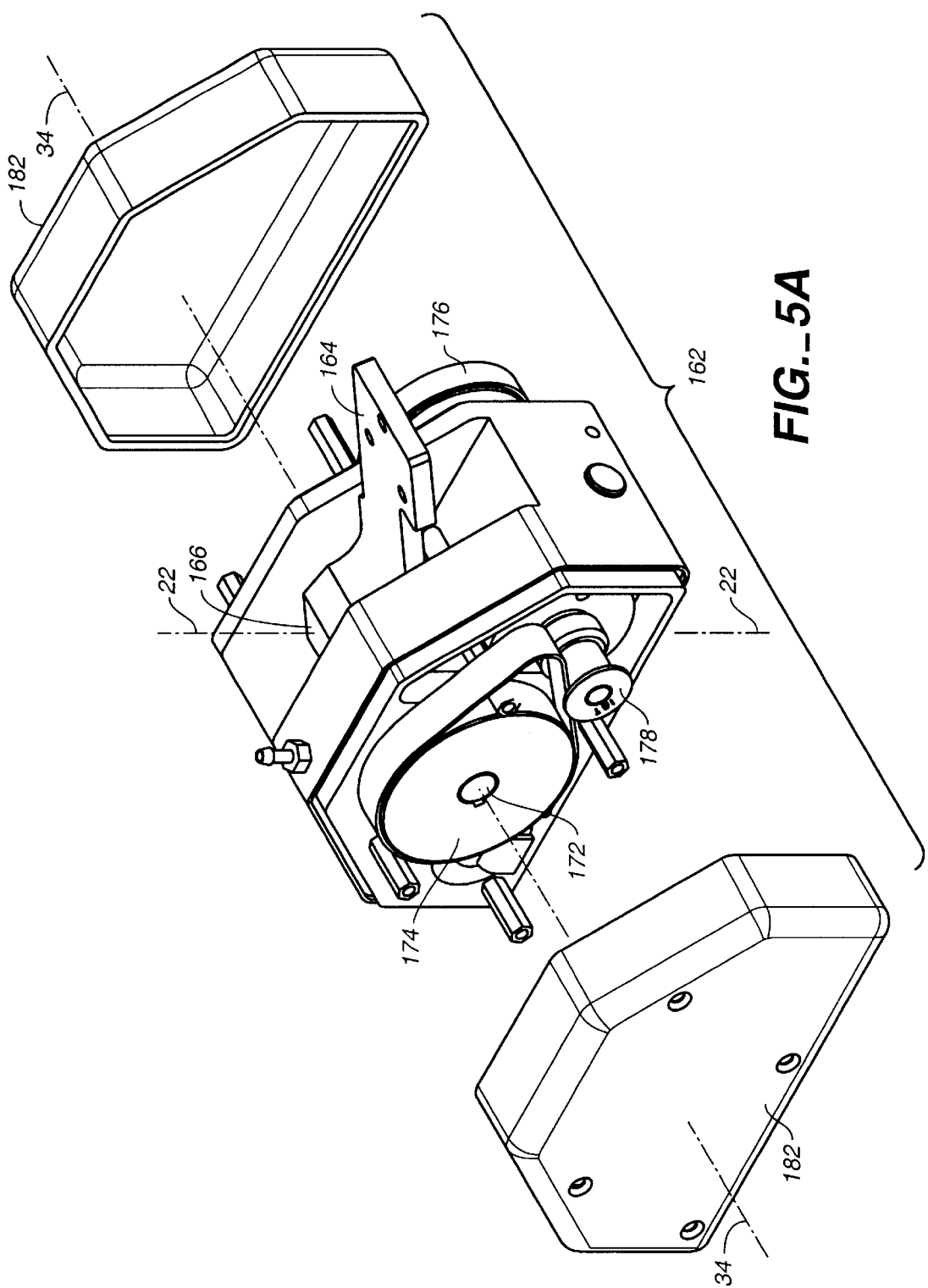
FIG._5A

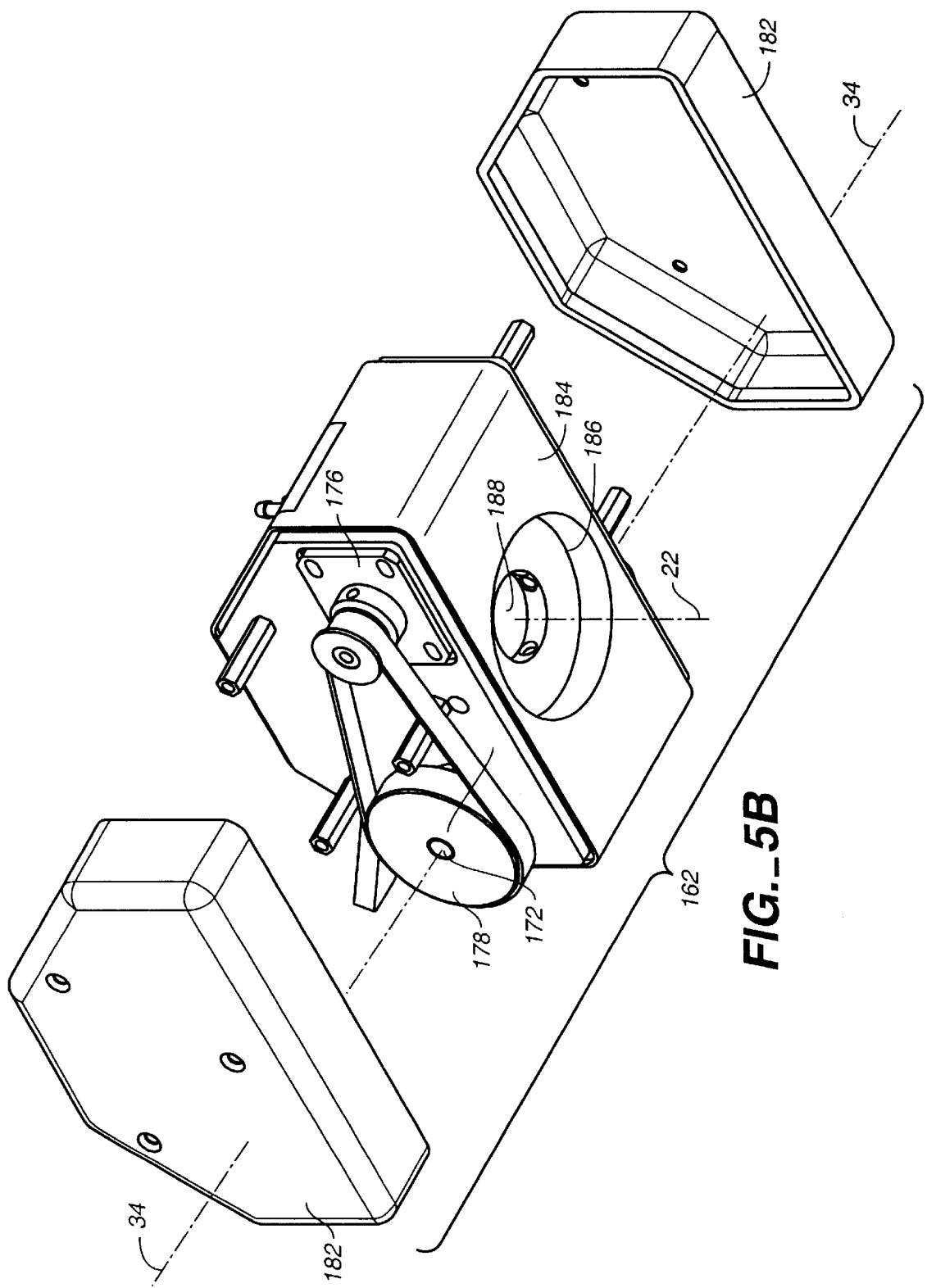
FIG._5B

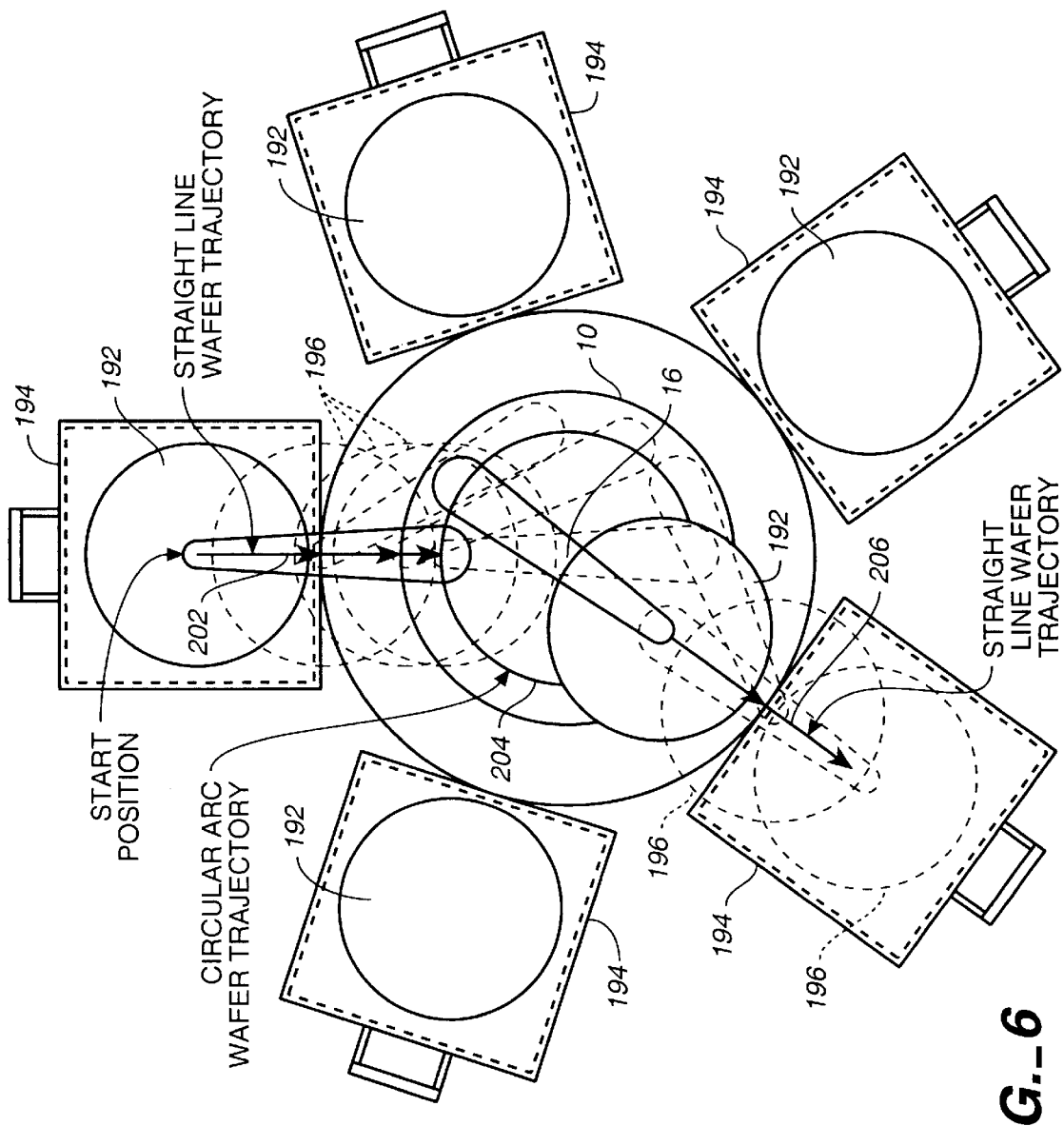
FIG._6

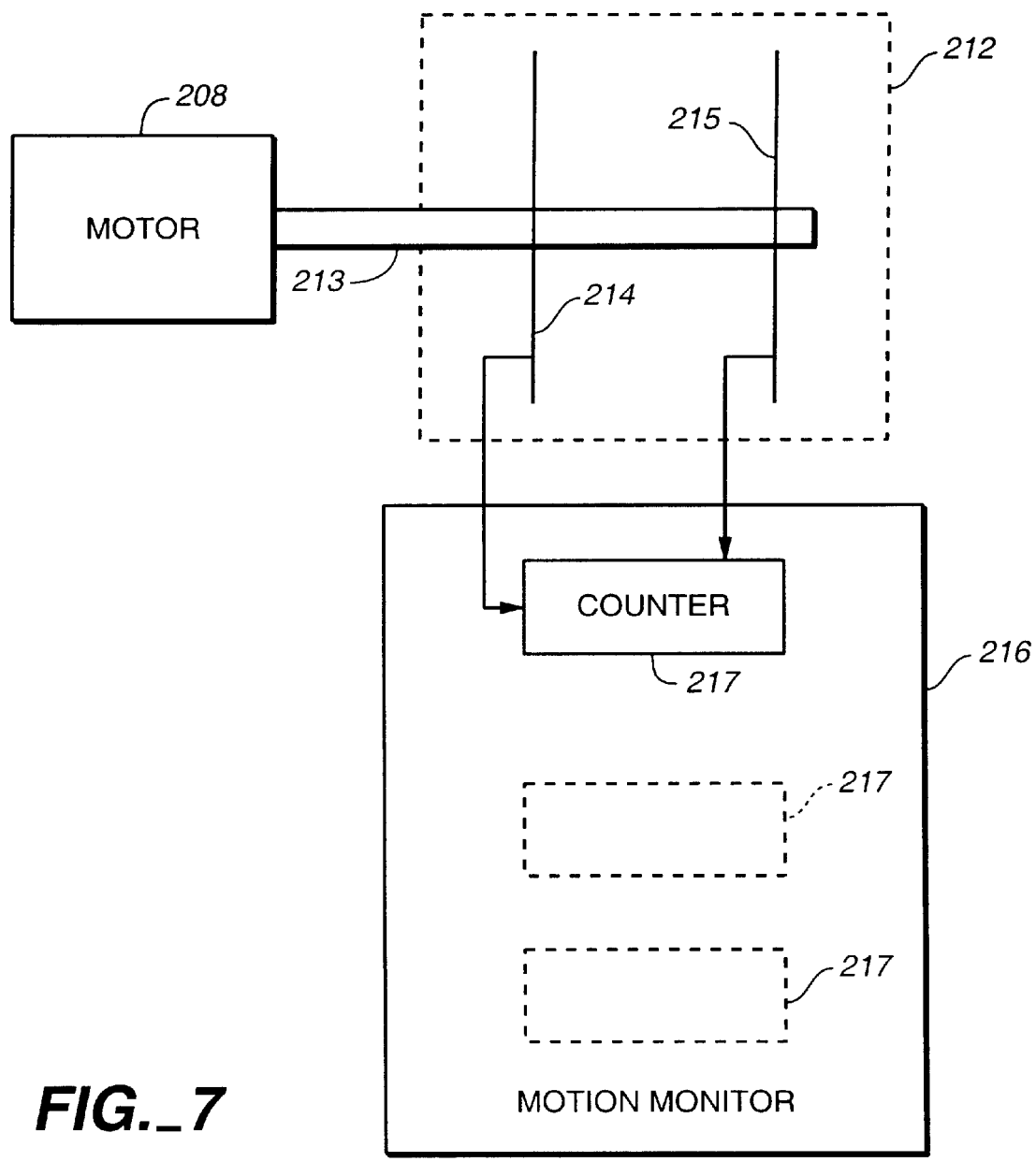
FIG._7

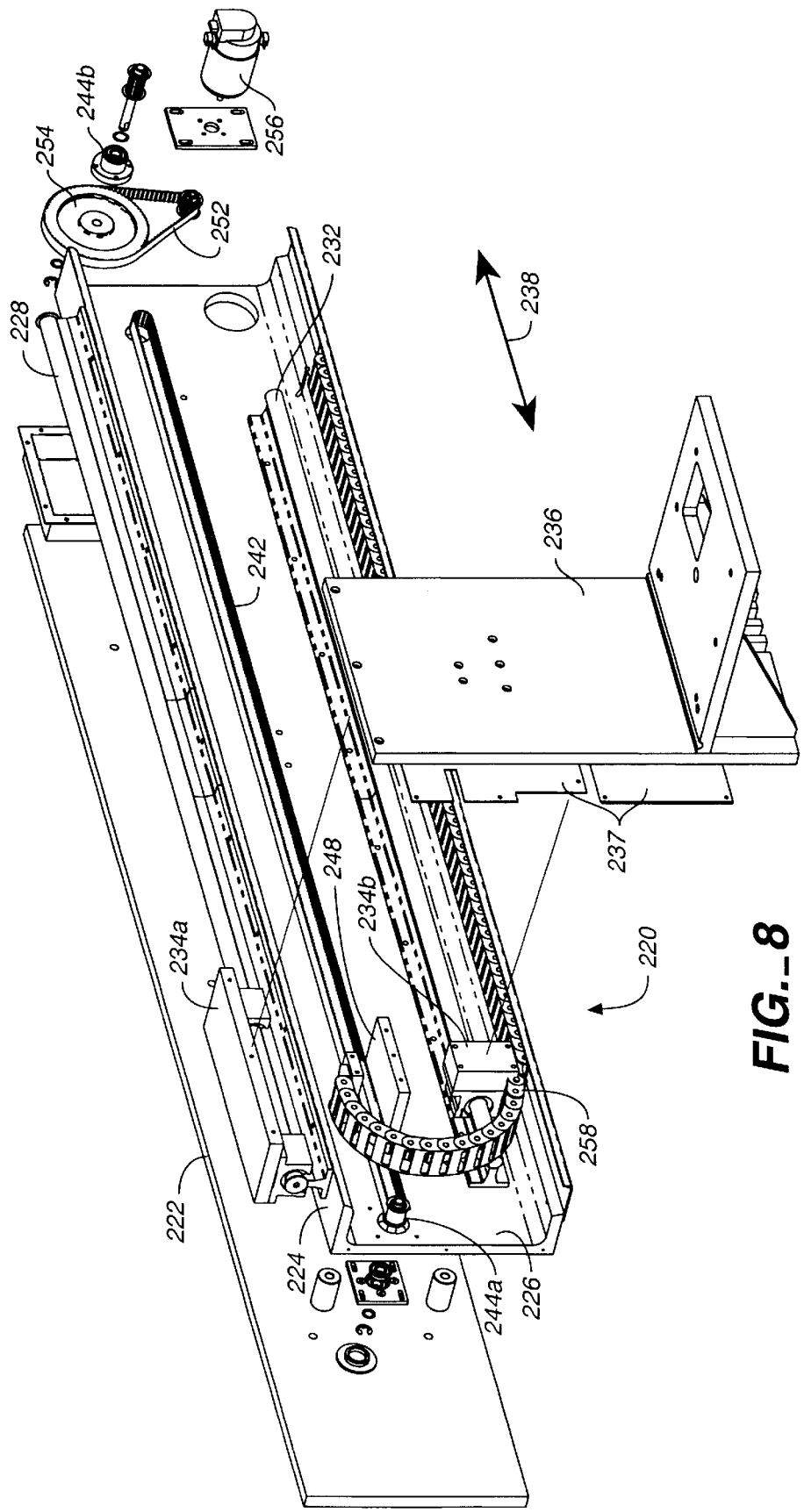
FIG._8

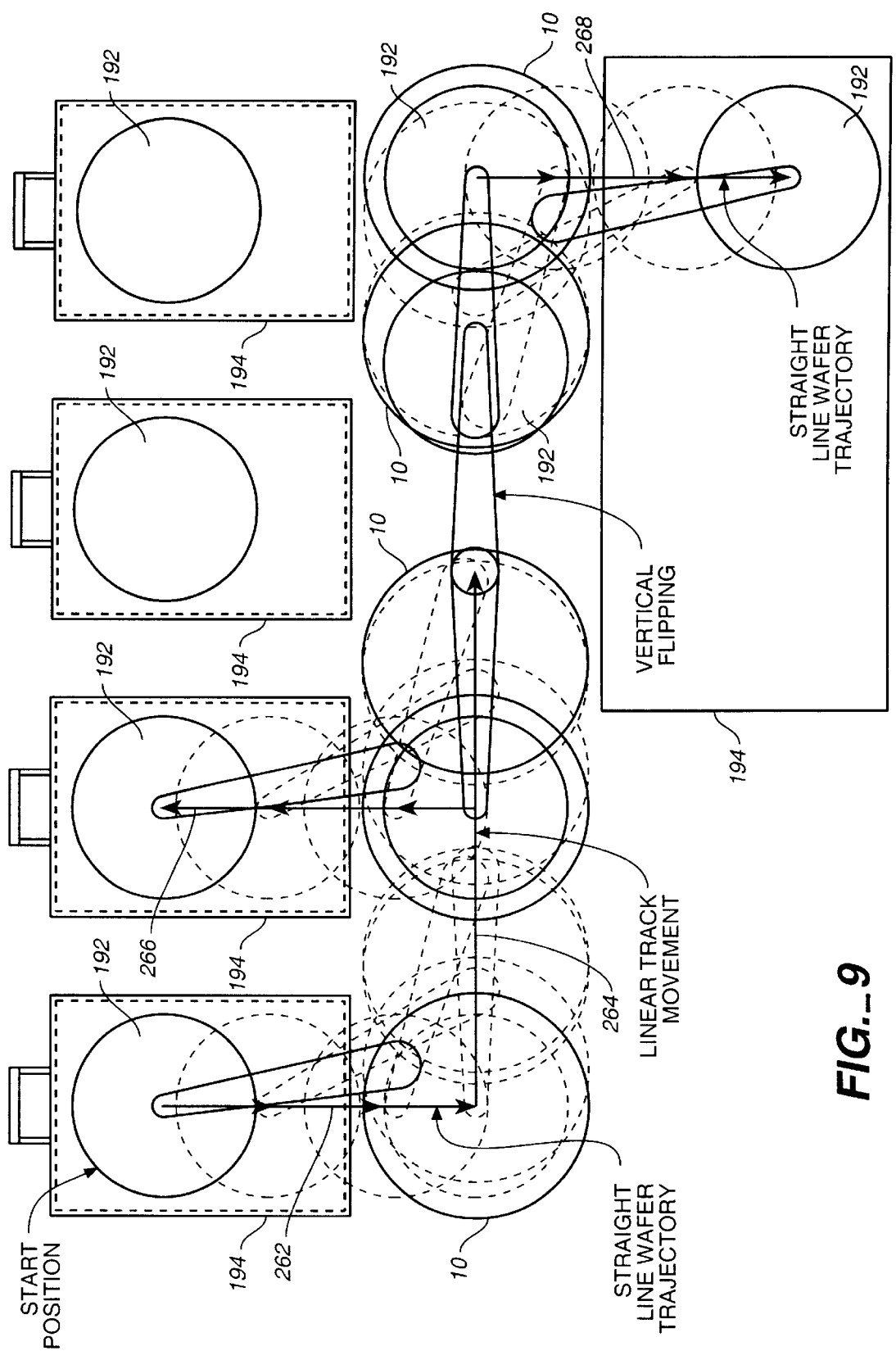
FIG._9

SIMPLIFIED AND ENHANCED SCARA ARM

BACKGROUND OF THE INVENTION

1. Field of the Invention

The present invention relates generally to robot arms, and in particular to Selective Compliance Articulated Robot for Assembly ("SCARA") arms.

2. Description of the Prior Art

A truly general-purpose industrial robot arms usually provides six independently moving axes, or joints. Each joint is driven using a linear or rotary actuator, like a servomotor. This type of robot is said to have six degrees of freedom ("DOF"), i.e., each independently driven axis provides one DOF. Three DOF are used to position a workpiece in the Cartesian x-y-z space, and the other three DOF are used to orient the workpiece at specific pitch, roll and yaw angles with respect to the x, y, and z axis, respectively. Many industrial applications employ general-purpose robot arms because of their maximum flexibility in manipulating workpieces.

In comparison, conventional robot arms used for handling semiconductor wafers usually include at least two jointed links that move horizontally. A shoulder joint of one link, sometimes referred to as an upper arm, is supported by an elevator. A second link, sometimes referred to as the forearm, connects at an elbow joint to the distal end of the upper arm. A third link that holds semiconductor wafers, usually called and end-effector, attaches at a wrist joint to a distal end of the forearm.

One example of this second type of robot arm appears in U.S. Pat. No. 4,947,702 entitled "Industrial Robot" that issued Aug. 14, 1990, ("the '702 patent"). The SCARA arm disclosed in the '702 patent includes a base which supports an end-effector via an upper arm and a forearm. This SCARA arm includes an elevator that raises and lowers the shoulder joint of the upper arm. The upper arm and forearm are rotatably coupled to each other at an elbow joint. This SCARA arm also includes driving motors, that are located in the base body, to independently energize all motion of the upper arm, forearm, and end-effector. Mechanical transmissions, located in the base body, and in the two arms, couple the respective driving motors to each of the arms, and the end-effector.

During operation of this SCARA arm, one of the driving motors first raises or lowers the upper arm until it is at a desired height. Then, another driving motor rotates the upper arm in a horizontal plane about a shoulder joint to a desired orientation. Via a belt transmission located in the upper arm, yet another driving motor then rotates the forearm, also in a horizontal plane, about an elbow joint to a desired orientation. Finally, the end-effector of this SCARA arm rotates about a wrist joint, again in a horizontal plane, to a desired position. Including the elevator mechanism, the SCARA arm disclosed in the '702 patent provides a total of four (4) DOF.

The '702 patent states that locating the driving motors in the base body avoids having drive units located at the arm joints and wrist joint. Furthermore, the '702 patent also states that locating the driving motors in the base body increases SCARA arm reliability since electrical cables connecting to its driving motor are less liable to vibrate and/or break.

U.S. Pat. No. 5,064,340 entitled "Precision Arm Mechanism" that issued Nov. 12, 1991, ("the '340 patent") discloses a SCARA arm similar to that of the '702 patent with all driving motors located in a base of the robot arm below the rotating upper arm and forearm. The '340 patent further discloses individual belt drives, located respectively in the upper arm and forearm, which produce linear motion of a wrist joint that joins the end-effector to the forearm. The '340 patent states that this belt drive positions the end-effector more accurately than other types of transmissions, and avoids transmitting any chattering or cogging of the driving motor to the end-effector.

U.S. Pat. No. 5,178,512 entitled "Precision Robot Apparatus" that issued Jan. 12, 1993, ("the '512 patent") discloses a SCARA arm similar to that of the '702 patent with all driving motors located in a base of the robot arm below the rotating upper arm and forearm. Similar to the '340 patent, the '512 patent employs belt drive transmissions to move the wrist joint that couples between an end of the forearm and an end-effector. The '512 patent emphasizes the importance of placing the diving motors near the bottom of the SCARA arm.

U.S. Pat. No. 5,741,113 entitled "Continuously Rotatable Multiple Link Robot Arm Mechanism" that issued Apr. 21, 1998, ("the '113 patent") discloses a SCARA arm similar to that of the '702 patent with all driving motors located in a base of the robot arm below the rotating upper arm and forearm. The '113 patent further discloses the use to two motors capable of synchronized operation that permits moving the end-effector along an arbitrary path without lockout spaces to virtually any location in an available work space. The SCARA arm disclosed in the '113 patent also avoids any robot arm rewind requirement while permitting continuous rotation in one direction without kinking, twisting or breaking a conduit that delivers vacuum to the end-effector for gripping a semiconductor wafer workpiece.

U.S. Pat. No. 5,746,565 entitled "Robotic Wafer Handler" that issued May 5, 1998, ("the '565 patent") discloses a SCARA arm similar to that of the '702 patent with all driving motors located in a base of the robot arm below the rotating upper arm and forearm. The '565 patent further discloses a SCARA arm whose upper arm and forearm are independently rotatable through multiple revolutions greater than 360°. The rotation plane of the upper arm and forearm may be raised or lowered, and may also be tilted. A track disclosed in the '565 patent permits moving horizontally back and forth the shoulder joint about which the upper arm rotates.

U.S. Pat. No. 5,789,890 entitled "Robot Having Multiple Degrees of Freedom" that issued Aug. 4, 1998, ("the '890 patent") discloses a SCARA arm similar to that of the '702 patent with all driving motors for the upper arm and forearm being located in a base of the robot arm below the rotating upper arm and forearm. The wrist joint of the SCARA arm disclosed in the '890 patent carries motors for energizing roll, pitch and yaw motions of the arm's end-effector. The '702 patent states that the roll, pitch and yaw motions-in combination with the motions provided by the upper arm and forearm permit any desired three-dimensional motion of the end-effector, i.e. provide a total of six (6) DOF.

One characteristic shared by most of the SCARA arms described thus far is that rotation about one of the arm's joint's induces rotation about another of the arm's joints. The SCARA arms disclosed in the '340 and '890 patents exhibit this characteristic fully. That is, rotation about any of the joints of the SCARA arms disclosed in the '340 and '890 patents induces rotation about the arm's other joints. The SCARA arms disclosed in the '113, '702 and '512 patents also partially exhibit this characteristic. That is, for the SCARA arms disclosed in the '113, '702 and '512 patents rotation about an earlier joint, e.g. the shoulder joint, induces rotation about later joints, e.g. the forearm and end-effector joints. However, these SCARA arms do not exhibit the converse of this characteristic. That is, for the SCARA arms disclosed in the '113, '702 and '512 patents rotation about a later joint, e.g. the end-effector joint, does not induce rotation about an earlier joint, e.g. the forearm or shoulder joints. Clearly, controlling the position of a SCARA arm's end-effector when rotation of an earlier joint induces rotations which displace the end effector is more complicated than controlling the end-effector's position if all joint rotations are independent of one other.

For semiconductor manufacturing, the task of delivering wafers to manufacturing tools requires a robot that is optimized to minimize particulate contamination generated by moving joints, and to maximize reliability. To simplify mechanisms required for moving semiconductor wafers, many semiconductor tools move them parallel to the ground plane, i.e., in the x-y plane. Holding the wafers parallel to the ground plane at the load and unload locations eliminates any requirement for pitching and/or rolling wafers about the ground plane during wafer transfers. Furthermore, the yaw capability needed to place wafers in precise orientation inside process tools can also be reduced if a robot arm picks up wafers in a correct yaw angle relative to the process tools. In practice, robotic semiconductor manufacturing tools usually employ a separate device called pre-aligner to position wafers prior to transfer. The pre-aligner finds a wafer orientation and positions the wafer in an exact yaw angle relative to a robot arm's end-effector before the robot arm picks the wafer. Using a pre-aligner, a three (3) DOF robot should be adequate for wafer-handling applications. Robot arms such as those disclosed in the '340, '113 and '512 patents exhibit three (3) DOF that are adequate for most semiconductor wafer handling operations.

In addition to the minimum DOF requirement, many wafer process tools require robots that are capable of handling wafers in wet environments. Processing tools like those used for Chemical Mechanical Polishing ("CMP") require wafer handling robots that operate in a dirty environment filled with water mist and sometimes polishing slurry. To provide high reliability by reducing the possible entry of liquid, a wafer-handling robot for environments such as the CMP processing environment should also have as few moving joints as practicable. Although those 3-DOF robot arms disclosed in the '340, '113 and '512 patents provide only three (3) degrees of freedom, their arms still include four (4) joints which move relative to each other. In comparison, the SCARA arm disclosed in the '565 patent combines the end-effector with the forearm to eliminate one joint. However, this robot arm exposes both joints of the upper arm to the working environment. Thus, using the SCARA arm disclosed in the '565 patent in a wet processing environment is uninviting. In addition to exposing the SCARA arm to moisture and contamination, some wet tools used in wet processing also require turning wafers over before delivery to the next processing operation.

Traditionally, parametric data describing physical characteristics of individual SCARA arms have been stored in a separate motion controller. Thus, previously each individual SCARA arm has been paired with a properly programmed motion controller. During installation, maintenance or repair, mismatching a SCARA arm and a motion controller frequently produces operational difficulties because the mismatched motion controller applies incorrect parametric data in attempting to control SCARA arm motion.

BRIEF SUMMARY OF THE INVENTION

An object of the present invention is to provide a SCARA arm adapted for use in semiconductor manufacturing that has fewer moving joints.

Another object of the present invention is to provide a SCARA arm adapted for use in semiconductor manufacturing that has fewer joints which are exposed to contaminants, such as water mist and polishing slurry, that may be present in atmosphere surrounding the SCARA arm.

Yet another object of the present invention is to provide a SCARA arm that permits turning a workpiece over while concurrently moving all of the arm's joints.

Yet another object of the present invention is to provide a SCARA arm having a modular end-effector.

Yet another object of the present invention is to provide a SCARA arm for which rotation at one of the arm's joints does not induce rotation at another of the arm's joints.

Yet another object of the present invention is to provide a SCARA arm that is easier to maintain and/or repair.

Yet another object of the present invention is to provide a SCARA arm that eliminates complex mechanical transmissions.

Yet another object of the present invention is to provide a more reliable SCARA arm.

Yet another object of the present invention is to provide a lower cost SCARA arm.

The present invention in one embodiment is a three DOF SCARA arm adapted for handling semiconductor wafers. The SCARA arm may include a modular end-effector assembly attached to distal joint of the SCARA arm. An advantageous configuration of the SCARA arm includes an end-effector which permits turning semiconductor wafers over. This semiconductor wafer flipping mechanism moves wafers through an arc above the SCARA arm. That is, the space used in flipping a semiconductor wafer over is separate from space used in transporting semiconductor wafers by rotating about other joints of the SCARA arm.

A SCARA arm in accordance with the present invention includes a support column having a base above which projects an open column assembly. The base of the support column permits securing the SCARA arm to a mounting structure while the open column assembly includes an arm-assembly drive. The arm-assembly drive includes a hollow tube which is extendable and retractable with respect to the base of the support column parallel to a Z-axis of the support column that is oriented along the column assembly. The arm-assembly drive also includes a Z-axis drive that is coupled to the hollow tube for energizing its extension and retraction. A shaft, that is supported within the tube by bearings located near both of its ends, has a distal end, located furthest from the base of the support column, that is adapted to receive an arm assembly. Supporting the shaft on bearing within the hollow tube permits rotating the shaft about the Z-axis of the support column. The arm-assembly drive also includes an arm-assembly rotary-drive that is coupled to the shaft for energizing its rotation.

This SCARA arm also includes an arm assembly which has an arm base-plate that is secured to the shaft for supporting the arm assembly therefrom. Supporting the arm assembly from the shaft providing the arm assembly with:

1. a DOF for extending and retracting the arm assembly parallel to the Z-axis with respect to the base of the support column to any position permitted by a linear bearing included in the support column; and 2. a second DOF for rotating the arm assembly about the Z-axis of the support column.

The arm base-plate carries a wrist joint that is displaced from the Z-axis about which the arm assembly rotates. The wrist joint is adapted to have an end-effector secured thereto to be rotatable about a wrist-joint axis that passes through the wrist joint. The arm base-plate also carries an end-effector rotary-drive that is coupled to the wrist joint for energizing rotation of the end-effector about the wrist-joint axis. An end-effector, secured to the wrist joint, adapts the SCARA arm for gripping a workpiece, and provides the arm assembly of the SCARA arm with a third DOF for rotating the end-effector about the wrist-joint axis.

The wafer flipping end-effector includes an end-effector mount by which the end-effector is secured to the wrist joint. The end-effector mount includes a flipper joint which is adapted for carrying a workpiece gripper and permits rotating the workpiece gripper about a flipper-joint axis that is not oriented parallel to the wrist-joint axis of the arm assembly. The end-effector mount also includes a flipper drive that is coupled to the flipper joint for energizing rotation of a workpiece gripper about the flipper-joint axis. This particular end-effector provides the SCARA arm with a fourth DOF for turning over a semiconductor workpiece gripped by the end-effector.

The SCARA arm as described thus far is particularly suited for transporting semiconductor wafers between processing stations arranged in a circular configuration around the SCARA arm. Mounting the SCARA arm on a linear track adapts it for transporting semiconductor wafers between processing stations arranged along a linear path.

These and other features, objects and advantages will be understood or apparent to those of ordinary skill in the art from the following detailed description of the preferred embodiment as illustrated in the various drawing figures.

BRIEF DESCRIPTION OF THE DRAWING

FIGS. 1A and 1B are perspective views illustrating a SCARA arm in accordance with the present invention with its arm assembly and end-effector disposed in two differing orientations;

FIG. 2A is a partially exploded perspective view illustrating the SCARA arm of FIGS. 1A and 1B with its arm assembly extended away from a base of its support column and with a skirt removed therefrom, and with an inner column-cover removed to reveal the SCARA arm's support column with a printed circuit board assembly secured thereto;

FIG. 3A is a perspective view illustrating the support column of the SCARA arm taken along the line 3A—3A in FIG. 2 with the printed circuit board controller removed to uncover a Z-axis drive included therein;

FIG. 3B is a perspective view illustrating the support column taken along the line 3B—3B in FIG. 3A depicting an arm-assembly rotary-drive included therein;

FIG. 3C is a perspective view illustrating the support column enclosed within a column-cover;

FIG. 4 is a perspective view of the arm assembly included in the SCARA arm depicted in FIGS. 1A and 1B with an arm cover raised above an arm base-plate to reveal an end-effector rotary-drive that is enclosed thereunder;

FIGS. 5A and 5B are alternative exploded perspective views of one end-effector mount which has a flipper joint together with a flipper drive that is coupled to the flipper joint for energizing rotation of a workpiece gripper of the end-effector about the flipper-joint axis for turning a workpiece over;

FIG. 6 is a plan view depicting a typical application in which semiconductor wafers are transported between processing stations arranged in a circular configuration around the SCARA arm;

FIG. 7 is a block diagram schematically depicting a motor and encoder used in controlling movements at joints of the SCARA arm depicted in FIGS. 1A and 1B;

FIG. 8 is an exploded perspective view illustrating a linear track adapted to receive the SCARA arm depicted in FIGS. 1A and 1B for moving the arm between processing stations arranged in a linear configuration; and FIG. 9 is a plan view depicting a typical application in which semiconductor wafers are transported between processing stations arranged in a linear configuration.

DETAILED DESCRIPTION

FIGS. 1A and 1B both depict a SCARA arm in accordance with the present invention referred to by the general reference character 10. FIGS. 1A and 1B illustrate differing configurations for the SCARA arm 10 with an arm assembly 12 and an end-effector 14 disposed in two differing orientations. The SCARA arm 10 moves between the two configurations depicted respectively in FIGS. 1A and 1B by:

1. rotating the arm assembly 12 about a Z-axis 16 as indicated by a double-headed curved arrow 18;
2. pivoting the end-effector 14 about a wrist-joint axis 22 as indicated by a double-headed curved arrow 24; and
3. rotating a workpiece gripper 32 about a flipper-joint axis 34 as indicated by a double-headed curved arrow 36.

As the arm assembly 12 rotates about the Z-axis 16, a cylindrically-shaped outer skirt 42, which depends from an arm base-plate 44 of the arm assembly 12 toward a base 46 of a support column 48 that is shown in greater detail in FIG. 2, moves with the arm assembly 12. Numerous holes 52 piercing the base 46 are used in securing the SCARA arm 10 to a mounting structure such as a semiconductor wafer processing tool, or a floor of a building.

As depicted in greater detail in FIGS. 2, 3A and 3B, the support column 48 includes an open column assembly 54 which projects upward above the base 46 of the support column 48. The preferred configuration for the column assembly 54 includes two vertically oriented posts 62a and 62b each respectively having upper ends that are rigidly fastened to diametrically opposite sides of an annularly-shaped top plate 64. Lower ends of the posts 62a and 62b are rigidly fastened to the base 46. A printed circuit board assembly 66, that provides a digital electronic monitor for the SCARA arm 10, spans between the posts 62a and 62b on one side of the support column 48.

Referring specifically now to FIG. 3A, the post 62b includes a vertically oriented linear bearing assembly or track 72 along which a carriage 74 may move up and down within the support column 48 as part of an arm-assembly elevator 76. The arm-assembly elevator 76 also includes a vertically oriented leadscrew 78 that is located within the support column 48 near the track 72. Ends of the leadscrew 78 are respectively received into bearings 82 that are secured respectively to the base 46 and to the top plate 64. A leadscrew nut 84, that is threaded onto the leadscrew 78, is fixed to the arm-assembly elevator 76 so that rotation of the leadscrew 78 either raises or lowers the arm-assembly elevator 76 parallel to the Z-axis 16. Fixed to the top plate 64, a Z-axis motor and transmission 86, that is part of the arm-assembly elevator 76, energizes rotation of the leadscrew 78. The combined leadscrew 78, bearings 82, leadscrew nut 84 and Z-axis motor and transmission 86 provide a Z-axis drive for raising and lowering the arm-assembly elevator 76 parallel to the Z-axis 16.

In addition to being fixed to the leadscrew nut 84, the arm-assembly elevator 76 is also fixed to a hollow outer tube 92 that is also included in the arm-assembly elevator 76. As depicted in the illustrations of FIGS. 3A and 3B, the outer tube 92 extends from the top plate 64 of the support column 48 almost to the base 46 thereof. As indicated in FIG. 2, raising or lowering the arm-assembly elevator 76 causes the outer tube 92 to extend out of the top plate 64, or to retract into the support column 48 along the Z-axis 16.

The outer tube 92 supports within it a hollow inner shaft 96 only an upper end of which appears in FIGS. 3A and 3B furthest from the base 46. Bearings located at the top and bottom of the outer tube 92, that are not illustrated in any of the FIGS., support the inner shaft 96 for rotation about the Z-axis 16. Because the inner shaft 96 is hollow, signal and pneumatic lines can be routed through the inner shaft 96 from within the support column 48 to the arm assembly 12. A lower end of the inner shaft 96, which extends beneath the outer tube 92 receives a pulley 102. As best illustrated in FIG. 3B, the pulley 102 is coupled to a motor 104 through a three-stage belt-pulley speed reduction drive train 106. Both the motor 104 and the drive train 106 are both located at a base of the outer tube 92, and are included in the arm-assembly elevator 76. The motor 104 and the drive train 106 form an arm-assembly rotary-drive that is coupled to the inner shaft 96 to energize rotation of the arm assembly 12 about the Z-axis 16.

As illustrated in FIG. 3C, the support column 48 is shielded from contaminants in atmosphere surrounding the SCARA arm 10 by a inner column-cover 108 which encircles the support column 48 between the base 46 and the top plate 64. The base 46 of the support column 48 includes a port 112, depicted in FIG. 3B, that is adapted to receive a flow of clean, filtered air to pressurize the support column 48 enclosed by the column-cover 108. Arranged in this way, the column-cover 108 forms a physical barrier that separates the interior of the support column 48 from the surrounding atmosphere. The only possible path by which contaminants may enter or leave the support column 48 is through a narrow gap between the top plate 64 and the outer tube 92, and through the hollow inner shaft 96. However, pressurizing the support column 48 obstructs entry of contaminants in atmosphere surrounding the SCARA arm 10 into the support column 48 via either of these pathways. For the pathway between the top plate 64 and the outer tube 92, the outer skirt 42 in conjunction with the column-cover 108 establishes a labyrinth seal that obstructs entry of contaminants in atmosphere surrounding the SCARA arm 10 into the support column 48.

FIG. 4 illustrates the arm assembly 12 of the SCARA arm 10 with an arm cover 122 raised above the arm base-plate 44 to reveal an end-effector rotary-drive that is enclosed thereunder. Securing the arm base-plate 44 to the end of the inner shaft 96, depicted in FIGS. 3A–3C, supports the arm assembly 12 from the inner shaft 96 and correspondingly from the support column 48. Supporting the arm assembly 12 from the inner shaft 96 provides the arm assembly 12 of the SCARA arm 10 with:

1. a first DOF for extending and retracting the arm assembly 12 with respect to the base 46 of the support column 48 as indicated by a double-headed arrow 124 in FIG. 2 to any position permitted by the track 72; and
2. a second DOF for rotating the arm assembly 12 about the Z-axis 16 of the support column 48 as indicated by the curved arrow 18.

As illustrated in FIGS. 2 and 4, the arm base-plate 44 carries a wrist joint 132 that is:

1. displaced from the Z-axis 16 about which the arm assembly 12 rotates; and
2. receives and supports the end-effector 14 secured thereto so the end-effector 14 is rotatable about the wrist-joint axis 22 that passes through the wrist joint 132.

The wrist joint 132 includes a hollow wrist-joint shaft 134 supported by two bearings that are located inside a bearing housing 136. An end of the wrist-joint shaft 134 nearest the arm base-plate 44 receives a pulley 138. The pulley 138 is coupled to a wrist motor 142 through a three-stage belt-pulley speed-reduction drive train 144. The combined pulley 138, wrist motor 142, and drive train 144 provide an end-effector rotary-drive that is coupled to the wrist joint 132 for energizing rotation of the end-effector 14 about the wrist-joint axis 22.

The arm cover 122 is pierced by an aperture 152 through which the wrist-joint shaft 134 and a portion of the bearing housing 136 protrudes when the arm cover 122 is secured to the arm base-plate 44. An O-ring 154, disposed on top of the bearing housing 136 to encircle the wrist-joint shaft 134, seals between the arm cover 122 and the wrist joint 132. In this way, the O-ring 154 blocks entry of contaminants in atmosphere surrounding the SCARA arm 10 past the wrist joint 132 into the arm assembly 12 between the arm cover 122 and the arm base-plate 44.

One alternative end-effector 14 with which the SCARA arm 10 may be equipped includes an end-effector mount 162, best illustrated in FIGS. 5A and 5B. The end-effector mount 162 includes a gripper mounting-plate 164 to which is fixed the workpiece gripper 32. The end-effector mount 162 also includes a flipper joint 166 which carries the gripper mounting-plate 164 with the workpiece gripper 32 attached thereto. The flipper joint 166 includes a flipper shaft 172 that is supported by two bearings, not depicted in any of the FIGS., that are located on opposite sides of the gripper mounting-plate 164. The flipper shaft 172 permits rotating the workpiece gripper 32 about the flipper-joint axis 34 that is preferably oriented perpendicular to, i.e. not oriented parallel to, the wrist-joint axis 22 of the arm assembly 12.

The end-effector mount 162 illustrated in FIGS. 5A and 5B also includes a pulley 174 that is fixed to one end of the flipper shaft 172. The pulley 174 is coupled to a flipper motor 176, illustrated in FIG. 5B, through a three-stage belt-pulley speed reduction flipper drive 178. The pulley 174, flipper motor 176, and flipper drive 178 provide a flipper drive that is coupled to the flipper motor 176 for energizing rotation of the workpiece gripper 32 about the flipper-joint axis 34 for turning a workpiece over. By rotating the flipper shaft 172 180°, a semiconductor wafer, held on the workpiece gripper 32, can be turned over while moving through an arc about the flipper-joint axis 34 above the arm assembly 12.

Two watertight covers 182, secured on opposite sides of the end-effector mount 162 to enclose the pulley 174, flipper motor 176, and flipper drive 178, obstruct entry of contaminants in atmosphere surrounding the SCARA arm 10 inside the end-effector mount 162. A lower surface 184 of the end-effector mount 162 has an annularly-shaped recess 186 formed therein that encircles a mounting hole 188 which receives and is locked to an upper end of the wrist-joint shaft 134. The recess 186 fits over and surrounds the portion of the bearing housing 136 that protrudes above the arm cover 122. Similar to the outer skirt 42, the recess 186 covers the wrist joint 132 to obstruct entry of contaminants in atmosphere surrounding the SCARA arm 10.

Configured in this way, the wrist joint 132 provides the arm assembly 12 of the SCARA arm 10 with a third DOF for rotating the end-effector 14 about the wrist-joint axis 22. Correspondingly, the end-effector mount 162, illustrated in FIGS. 5A and 5B, provides the SCARA arm 10 with a fourth DOF that permits turning over a workpiece held by the workpiece gripper 32. If a particular wafer processing operation does not require turning semiconductor wafers over, the end-effector mount 162 with the flipper joint 166 may be omitted, and the workpiece gripper 32 merely rigidly fixed directly to the end of the wrist-joint shaft 134 that protrudes above the bearing housing 136.

As described thus far, all joints in the SCARA arm 10 of the present invention are shielded and sealed from the external environment thus adapting the SCARA arm 10 for handling semiconductor wafers in a dirty environment filled with water mist and sometimes silicon sludge. Furthermore, in comparison with a SCARA arm having more moving-joints, the SCARA arm 10, by providing three DOF with only two moving joints, reduces possibilities both that the SCARA arm 10 might contaminate its surrounding environment, and that a contaminated environment might induced failure of the SCARA 40 arm 10. Moreover, in comparison with conventional SCARA arms used in such an environment, the SCARA arm 10 avoids any additional requirement for shielding the arm's moving joints.

FIG. 6 depicts a typical application where semiconductor wafers 192 are transported among five processing stations 194 arranged in a circular configuration around the SCARA arm 10. In the illustration of FIG. 6, the base 46 of the SCARA arm 10 is rigidly attached to a processing tool's frame. Dashed circles 196 represent trajectories for a semiconductor wafer 192 being transferred between selected processing stations 194 without using the flipper joint 166. A straight arrow 202 depicts movement of the center of the semiconductor wafer 192 out of the processing station 194 produced by concurrent coordinated rotation of the arm assembly 12 about the Z-axis 16 and the end-effector 14 about the wrist-joint axis 22. A curved arrow 204, originating at the end of the straight arrow 202, depicts a circular arc trajectory for the semiconductor wafer 192 as the arm assembly 12 rotates about the Z-axis 16. Finally, a straight arrow 206 depicts movement of the center of the semiconductor wafer 192 into another of the processing stations 194 again produced by concurrent coordinated rotation of the arm assembly 12 about the Z-axis 16 and the end-effector 14 about the wrist-joint axis 22.

In most ways functions performed by the digital electronic monitor provided by the printed circuit board assembly 66 are to completely conventional. However, the printed circuit board assembly 66 included in the SCARA arm 10 departs from prior digital electronic monitors by including a non-volatile, electrically erasable programmable read only memory ("EEPROM") for storing data that is specific to each SCARA arm 10. Such arm specific data includes information such as a serial number for the SCARA arm 10, customer information, and parametric data which may be necessary to optimize performance of the SCARA arm 10 and/or diagnose system health. The EEPROM included in the printed circuit board assembly 66 permits automatically downloading at least some of the stored arm specific data, particularly the parametric data, into a motion controller during their initialization for subsequent use by the motion controller in controlling operation of the SCARA arm 10. Storing such data physically in the SCARA arm 10 facilitates installation and servicing by permitting readily interchanging different SCARA arms 10. Furthermore, storing the parametric data in the printed circuit board assembly 66 completely eliminates any possibility that the motion controller might apply incorrect parametric data in attempting to control operation of a particular SCARA arm 10.

In addition to the EEPROM, the printed circuit board assembly 66 also departs from traditional digital electronic monitors by including a microcontroller dedicated solely to monitoring the health of the SCARA arm 10. This microcontroller is programmed to continuously check the integrity of encoder outputs and sensor status. For example, if in the way described below ratios of encoder index counts and accumulated encoder position counts differ from established values, the microcontroller is programmed to send a message to the motion controller requesting service for the SCARA arm 10. Similarly, if vacuum applied to hold the semiconductor wafer 192 to the workpiece gripper 32 exceeds a pre-established threshold, then motion of the SCARA arm 10 may be immediately interrupted to prevent breaking the semiconductor wafer 192. Separating such health monitoring operations from motion control tasks, performed by the separate motion controller, permits both implementing more flexible health monitoring procedures, and providing better motion control performance.

To permit monitoring ratios of encoder index counts and accumulated encoder position counts, as illustrated in FIG. 7 each drive for positioning a joint of the SCARA arm 10, except the flipper joint 166, includes both an electric motor 208, e.g. the motor 104, the wrist motor 142, or the motor included in the Z-axis motor and transmission 86, and an optical encoder 212, that effectively share a common shaft 213. Conceptually, the encoder 212 may be understood as including both an index-pulse generating disk 214 and a movement-pulse generating disk 215. The movement-pulse generating disk 215 generates a fixed number of electrical pulses during a single revolution of the shaft 213, e.g. 4096. The index-pulse generating disk 214 generates one (1) index pulse per revolution of the shaft 213.

A motion monitor 216, included in the printed circuit board assembly 66, provides a separate counter 217 for each encoder 212 included in the SCARA arm 10. During initialization of the SCARA arm 10, each motion monitor 216 is zeroed after motion begins when the index-pulse generating disk 214 in the associated encoder 212 produces the first index pulse. Subsequently, each counter 217 in the motion monitor 216 continuously counts pulses from the corresponding movement-pulse generating disk 215 during subsequent rotation of the shaft 213. When the SCARA arm 10 is operating properly, each time the index-pulse generating disk 214 generates a successive index pulse, the number present in the motion monitor 216 equals an integer multiple of the fixed number of pulses produced by the movement-pulse generating disk 215 during each revolution of the shaft 213.

If a power failure occurs, the microcontroller included in the printed circuit board assembly 66 stores the encoder counts present in all the counters 217 into the EEPROM included in the printed circuit board assembly 66. Upon restoration of electrical power to the SCARA arm 10, the microcontroller fetches the encoder counts from the EEPROM and stores them back into the counters 217. Upon receiving authorization from an operator, the motion controller energizes the motors until each encoder 212 generates an index pulse. Energizing each of the motors in this way produces only a small motion at each joint of the SCARA arm 10. As each index-pulse generating disk 214 generates the next index pulse, the microcontroller reads the corresponding counter 217. If the SCARA arm 10 did not move during the power interruption, the numbers present in all counters 217 equal a multiple of the fixed number of pulses produced by the movement-pulse generating disk 215 during each revolution of the shaft 213, and operation of the SCARA arm 10 may resume immediately. If the number present in any counter 217 differs from a multiple of the fixed number of pulses produced by the movement-pulse generating disk 215 during each revolution, then the motion monitor 216 sends to the motion controller the message requesting service for the SCARA arm 10 because the SCARA arm 10 must be re-initialized before resuming operation.

FIG. 8 depicts a linear track, referred to by the general reference character 220, that is adapted to receive the SCARA arm 10. Mounting the SCARA arm 10 on the linear track 220 adapts it for transferring semiconductor wafers 192 among processing stations 194 that are arranged in a linear configuration. The linear track 220 includes an elongated mounting plate 222 that extends the full length of the linear track 220. An upper surface 224 of a U-shaped channel 226 supports an elongated upper shaft 228 that extends most of the length of the linear track 220. An elongated lower shaft 232, that also extends most of the length of the linear track 220, is secured within the U-shaped channel 226 near the bottom thereof. The upper shaft 228 and the lower shaft 232 respectively carry cross-slide bearing-assemblies 234a and 234b. An L-shaped robot-arm mounting-bracket 236, which receives the base 46 of the SCARA arm 10, spans between and is secured to both of the cross-slide bearing-assemblies 234a and 234b. The robot-arm mounting-bracket 236 carries two cable covers 237 that are secured to a surface thereof nearest to the U-shaped channel 226. Supported from the upper shaft 228 and the lower shaft 232 by the cross-slide bearing-assemblies 234a and 234b, the robot-arm mounting-bracket 236 carrying the SCARA arm 10 is moveable back and forth along the linear track 220 as indicated by a double headed arrow 238.

The linear track 220 also includes a linear drive for energizing movement of the robot-arm mounting-bracket 236 back and forth along the cross-slide bearing-assemblies 244a and 244b. This linear drive includes an timing belt 242 that encircles two pulleys 244a and 244b that are respectively located at opposite ends of the U-shaped channel 226. A bracket 248 couples the timing belt 242 to the robot-arm mounting-bracket 236 so movement of the timing belt 242 around the pulleys 244a and 244b drives the robot-arm mounting-bracket 236 along the cross-slide bearing-assemblies 244a and 244b. A single-stage belt-pulley speed-reduction drive train 252, that includes a pulley 254 secured to the pulley 244b on a side of the robot-arm mounting-bracket 236 opposite to the timing belt 242, is also included in the linear drive. An electric motor 256 supplies energy to the drive train 252 for moving the timing belt 242.

The linear track 220 also includes a flexible cable track 258 that is coupled at two separate locations both to the cross-slide bearing-assembly 244b and to the robot-arm mounting-bracket 236. Thus, as the robot-arm mounting-bracket 236 moves back-and-forth along the U-shaped channel 226, it is accompanied by this fixed segment of the cable track 258. This fixed segment of the cable track 258 either shoves or drags the remainder laterally along the linear track 220 as the robot-arm mounting-bracket 236 moves back-and-forth. When the SCARA arm 10 is mounted on the robot-arm mounting-bracket 236 and operating, the cable track 258 carries electrical cables, not illustrated in any of the FIGs., which couple the SCARA arm 10 to the motion controller, also not illustrated in any of the FIGs.

FIG. 9 depicts an application for the SCARA arm 10 supported on the linear track 220, not separately illustrated in FIG. 9, in which multiple wafer processing stations 194 are arranged in a linear configuration. Similar to the illustration of FIG. 6, dashed circles 196 represent trajectories for a semiconductor wafer 192 being transferred between selected processing stations 194. A straight arrow 262, a portion of a straight arrow 264, that is oriented perpendicularly to the straight arrow 262, and another straight arrow 266, that is oriented perpendicularly to the straight arrow 262, illustrate motion of the center of the semiconductor wafer 192 while being moved between immediately adjacent processing stations 194. These straight line movements of the semiconductor wafer 192 result from concurrent coordinated rotation of the arm assembly 12 about the Z-axis 16 and the end-effector 14 about the wrist-joint axis 22 together with movement of the support column 48 along the linear track 220.

If a wafer processing operation requires turning semiconductor wafers 192 over, the SCARA arm 10 can increase wafer-handling throughput by flipping the semiconductor wafer 192 over while the SCARA arm 10 transports the semiconductor wafer 192 between processing stations 194. The free space above the SCARA arm 10, which the end-effector mount 162 having the flipper joint 166 uses for turning semiconductor wafers 192 over, is separate from the free space used in transporting semiconductor wafers 192 by rotations about the Z-axis 16 and the wrist-joint axis 22. The existence of mutually exclusive free spaces for these two different types of motions assures a collision free wafer trajectory while concurrently moving all joints of the SCARA arm 10 including the flipper joint 166.

In FIG. 9, a gap between the end of the straight arrow 264 furthest from the straight arrow 262 and a straight arrow 268 indicates flipping the semiconductor wafer 192 over while it is being transported between processing stations 194. The gap between the end of the straight arrow 264 and the straight arrow 268 illustrates executing the wafer flipping motion concurrently with all other movements of the SCARA arm 10 while transporting the semiconductor wafer 192 between processing stations 194. Thus, the wafer flipping capability of the SCARA arm 10 permits optimal wafer handling throughput that previous SCARA arm designs cannot achieve.

Although the present invention has been described in terms of the presently preferred embodiment, it is to be understood that such disclosure is purely illustrative and is not to be interpreted as limiting. For example, as described above a SCARA arm 10 in accordance with the present invention may omit the end-effector mount 162 having the flipper joint 166 and merely support the workpiece gripper 32 at a fixed orientation with respect to the wrist-joint axis 22. Also, for an appropriate semiconductor wafer processing requirement a SCARA arm 10 may include more than one wrist joint 132, for example two wrist joints 132 disposed on diametrically opposite sides of the Z-axis 16, to increase throughput of the SCARA arm 10. Consequently, without departing from the spirit and scope of the invention, various alterations, modifications, and/or alternative applications of the invention will, no doubt, be suggested to those skilled in the art after having read the preceding disclosure. Accordingly, it is intended that the following claims be interpreted as encompassing all alterations, modifications, or alternative applications as fall within the true spirit and scope of the invention.

What is claimed is:

1. A Selective Compliance Articulated Robot for Assembly ("SCARA") arm comprising:
   a) a support column that includes:
      i. a base for securing the SCARA arm to a mounting structure;
      ii. an open column assembly which projects upward above the base of said support column and includes an arm-assembly drive that has:
         (1) a hollow tube which is extendable and retractable with respect to the base parallel to a Z-axis of said support column that is oriented along the column assembly;
         (2) a Z-axis drive that is coupled to the hollow tube for energizing extension and retraction thereof;
         (3) a shaft having a distal end which is:
            located furthest from the base of said support column; and
            adapted to receive an arm assembly, the shaft being supported within the hollow tube to be rotatable about the Z-axis of said support column; and
         (4) an arm-assembly rotary-drive that is coupled to the shaft for energizing rotation thereof; and
      iii. an inner column-cover which encircles the column assembly; and
   b) an arm assembly which includes an arm base-plate that is secured to the shaft for supporting said arm assembly therefrom thereby providing said arm assembly of the SCARA arm with:
      a first degree of freedom ("DOF") for extending and retracting said arm assembly with respect to the base of said support column; and
      a second DOF for rotating said arm assembly about the Z-axis of said support column;
   the arm base-plate carrying:
      i. a wrist joint that is:
         displaced from the Z-axis about which said arm assembly is rotatable; and
         adapted to receive and support an end-effector securable thereto to be rotatable about a wrist-joint axis that passes through the wrist joint;
      ii. an end-effector rotary-drive that is coupled to the wrist joint for energizing rotation of an end-effector about the wrist-joint axis;
      iii. an end-effector that is adapted for gripping a workpiece, the end-effector being secured to the wrist joint thereby providing said arm assembly of the SCARA arm with a third DOF for rotating the end-effector about the wrist-joint axis of said arm assembly; and
      iii. an outer skirt which depends from the arm base-plate to encircle the column-cover and to move with said arm assembly with respect to the base of said support column as said arm assembly extends, retracts and rotates;
   whereby the column-cover and the outer skirt establish a labyrinth seal which obstructs entry of contaminants in atmosphere surrounding the SCARA arm into the column assembly thereof.

2. The SCARA arm of claim 1 wherein the wrist-joint axis is oriented parallel to the Z-axis of said support column.

3. The SCARA arm of claim 1 wherein the end-effector is adapted for gripping a single semiconductor wafer.

4. The SCARA arm of claim 1, wherein the base of said support column includes a port that is adapted to receive a flow of clean, filtered air whereby the open column assembly enclosed by the column-cover is pressureable with respect to atmosphere surrounding the SCARA arm to thereby further obstruct entry into the open column assembly of contaminants in atmosphere surrounding the SCARA arm.

5. The SCARA arm of claim 1 wherein the hollow tube moves along a track during extension and retraction thereof, and the Z-axis drive includes a leadscrew which upon rotation causes the tube to extend and retract.

6. The SCARA arm of claim 1 wherein the end-effector further includes:
   (1) an end-effector mount:
      by which the end-effector is secured to the wrist joint; and
      that has a flipper joint which:
         is adapted for carrying a workpiece gripper; and
         permits rotating a workpiece gripper carried thereon about a flipper-joint axis that is not oriented parallel to the wrist-joint axis of said arm assembly;
   (2) a flipper drive that is coupled to the flipper joint for energizing rotation of a workpiece gripper about the flipper-joint axis for turning a workpiece over; and
   (3) a workpiece gripper that is secured to the flipper joint to be rotatable about the flipper-joint axis thereby providing the SCARA arm with a fourth DOF that permits turning over a workpiece gripped by the end-effector.

7. The SCARA arm of claim 6 wherein the flipper-joint axis is oriented perpendicular to the wrist-joint axis of said arm assembly.

8. The SCARA arm of claim 6 wherein the flipper drive is operable for turning over a workpiece while the Z-axis drive extends and retracts said arm assembly with respect to the base of said support column.

9. The SCARA arm of claim 6 wherein the flipper drive is operable for turning over a workpiece while the arm-assembly rotary-drive rotates said arm assembly about the Z-axis.

10. The SCARA arm of claims 6 wherein the flipper drive is operable for turning over a workpiece while the end-effector rotary-drive rotates the end-effector about the wrist-joint axis.

11. The SCARA arm of claim 1 further comprising a printed circuit board assembly that includes a non-volatile memory which stores data that is specific to the SCARA arm including parametric data used in controlling operation of the SCARA arm, at least some of the data specific to the SCARA arm that is stored in the non-volatile memory being downloadable from the non-volatile memory into a motion controller for use by the motion controller in controlling operation of the SCARA arm.

12. The SCARA arm of claim 1 further comprising a printed circuit board that includes a dedicated microcontroller which continuously monitors operation of the SCARA arm, and which produces an alarm condition if the SCARA arm operates improperly.

13. The SCARA arm of claim 4 further comprising:
   c) a linear track having:
      i. a mounting structure to which is secured the base of the support column, the mounting structure carrying said support column together with said arm assembly being moveable back and forth along the linear track; and
      ii. a linear drive that is coupled to the mounting structure for energizing movement of the mounting structure back and forth along the linear track.

* * * * *